(12) United States Patent
Kaneko et al.

(10) Patent No.: US 11,114,821 B2
(45) Date of Patent: Sep. 7, 2021

(54) SEMICONDUCTOR LASER WAFER AND SEMICONDUCTOR LASER

(71) Applicant: KABUSHIKI KAISHA TOSHIBA, Minato-ku (JP)

(72) Inventors: Kei Kaneko, Yokohama (JP); Shinji Saito, Yokohama (JP); Rei Hashimoto, Edogawa (JP); Tsutomu Kakuno, Fujisawa (JP); Yuichiro Yamamoto, Yokohama (JP); Tomohiro Takase, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 118 days.

(21) Appl. No.: 16/704,157

(22) Filed: Dec. 5, 2019

(65) Prior Publication Data

US 2020/0274331 A1   Aug. 27, 2020

(30) Foreign Application Priority Data

Feb. 27, 2019  (JP) .............................. JP2019-034322

(51) Int. Cl.
*H01S 5/00* (2006.01)
*H01S 5/34* (2006.01)
(Continued)

(52) U.S. Cl.
CPC .......... *H01S 5/3401* (2013.01); *H01S 5/0042* (2013.01); *H01S 5/22* (2013.01);
(Continued)

(58) Field of Classification Search
CPC .......... H01S 5/343; H01S 5/22; H01S 5/3402; H01S 5/34346; H01S 5/0042;
(Continued)

(56) References Cited

U.S. PATENT DOCUMENTS 9,001,858 B1 * 4/2015 Hirayama ............. H01S 5/3425
                                                         372/45.012
2010/0111127 A1 * 5/2010 Edamura ................ B82Y 20/00
                                                         372/45.012
(Continued)

FOREIGN PATENT DOCUMENTS

JP    2003-121391 A    4/2003
JP    2017-168594 A    9/2017

OTHER PUBLICATIONS

Evans, A. et al., "Buried heterostructure quantum cascade lasers with high continuous-wave wall plug efficiency," Applied Physics Letters, vol. 91, No. 071101, 2007, 4 pages.

*Primary Examiner* — Kinam Park
(74) *Attorney, Agent, or Firm* — Oblon, McClelland, Maier & Neustadt, L.L.P.

(57) ABSTRACT

A semiconductor laser wafer includes a substrate, a first semiconductor layer, an active layer, a second semiconductor layer, and a composition evaluation layer. The active layer is provided on the first semiconductor layer; multiple periods of pairs of a light-emitting multi-quantum well region and an injection multi-quantum well region are stacked in the active layer; the light-emitting multi-quantum well region is made of a first compound semiconductor and a second compound semiconductor. The second semiconductor layer is provided on the active layer. The composition evaluation layer is provided above the active layer and includes a first film and a second film; the first film is made of the first compound semiconductor and has a first thickness; and the second film is made of the second compound semiconductor and has a second thickness.

11 Claims, 7 Drawing Sheets

(51) Int. Cl.
*H01S 5/22* (2006.01)
*H01S 5/343* (2006.01)

(52) U.S. Cl.
CPC .......... *H01S 5/3402* (2013.01); *H01S 5/343* (2013.01); *H01S 5/3419* (2013.01); *H01S 5/34306* (2013.01); *H01S 5/34346* (2013.01); *H01S 5/34313* (2013.01); *H01S 2301/17* (2013.01); *H01S 2304/00* (2013.01)

(58) Field of Classification Search
CPC ............ H01S 5/34313; H01S 5/34306; H01S 5/3401; H01S 5/3419; H01S 2301/17; H01S 2304/00
See application file for complete search history.

(56) References Cited

U.S. PATENT DOCUMENTS

| | | | |
|---|---|---|---|
| 2011/0182311 A1* | 7/2011 | Yoshizumi | H01L 33/32 372/44.011 |
| 2013/0107903 A1* | 5/2013 | Mawst | H01L 21/0251 372/45.01 |
| 2017/0271849 A1* | 9/2017 | Saito | H01S 5/11 |

* cited by examiner

SEMICONDUCTOR LASER WAFER AND SEMICONDUCTOR LASER

CROSS-REFERENCE TO RELATED APPLICATIONS

This application is based upon and claims the benefit of priority from Japanese Patent Application No. 2019-034322, filed on Feb. 27, 2019; the entire contents of which are incorporated herein by reference.

FIELD

Embodiments described herein relate generally to a semiconductor laser wafer and a semiconductor laser.

BACKGROUND

A semiconductor laser that emits infrared includes an active layer in which multiple multi-quantum well structures are stacked.

The composition ratios and the thicknesses of the compound semiconductors included in a well layer and a barrier layer are affected by external disturbances (source material flux, fluctuation of the degree of vacuum, etc.) in the epitaxial crystal growth process. Also, as the number of cascade connection periods of the unit multi-quantum well structure increases, the crystal growth time of the active layer lengthens; and the effects of the external disturbances increase even more.

DETAILED DESCRIPTION

A semiconductor laser wafer includes a substrate, a first semiconductor layer, an active layer, a second semiconductor layer, and a composition evaluation layer. The first semiconductor layer is provided on the substrate. The active layer is provided on the first semiconductor layer; multiple periods of pairs of a light-emitting multi-quantum well region and an injection multi-quantum well region are stacked in the active layer; the light-emitting multi-quantum well region is made of a first compound semiconductor and a second compound semiconductor; and the injection multi-quantum well region is made of the first compound semiconductor and the second compound semiconductor. The second semiconductor layer is provided on the active layer. The composition evaluation layer is provided above the active layer and includes a first film and a second film; the first film is made of the first compound semiconductor and has a first thickness; and the second film is made of the second compound semiconductor and has a second thickness.

Embodiments of the invention will now be described with reference to the drawings.

Figure 1:
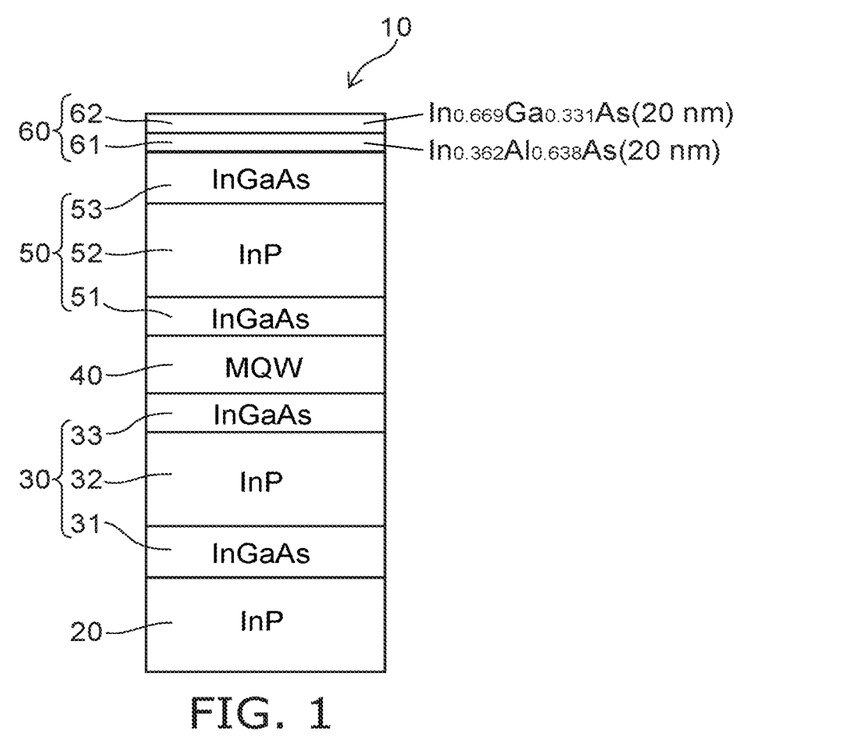
FIG. 1 is a schematic cross-sectional view of one chip of a semiconductor laser wafer according to a first embodiment of the invention.

FIG. 1 is a schematic cross-sectional view of one chip of a semiconductor laser wafer according to a first embodiment of the invention.

The semiconductor laser wafer 10 includes a substrate 20, a first semiconductor layer 30, an active layer 40, a second semiconductor layer 50, and a composition evaluation layer 60.

The first semiconductor layer 30 may include, for example, a first contact layer 31, a first cladding layer 32, a first light guide layer 33, etc., in this order on the substrate 20. The second semiconductor layer 50 may include, for example, a second light guide layer 51, a second cladding layer 52, a second contact layer 53, etc., in this order on the active layer 40.

The active layer 40 is provided on the first semiconductor layer 30. Multiple periods of pairs of a light-emitting multi-quantum well region and an injection multi-quantum well region are stacked in the active layer 40; the light-emitting multi-quantum well region is made of a first compound semiconductor and a second compound semiconductor; and the injection multi-quantum well region is made of the first compound semiconductor and the second compound semiconductor.

The composition evaluation layer 60 is provided on the second semiconductor layer 50 and includes a first film 61 and a second film 62; the first film 61 is made of the first compound semiconductor and has a first thickness; and the second film 62 is made of a mixed crystal of the second compound semiconductor and has a second thickness. The first compound semiconductor and the second compound semiconductor each may be, for example, ternary compound mixed crystals.

When the semiconductor laser is a quantum cascade laser (QCL) in which the carrier is an electron, the polarities of the first semiconductor layer 30 and the second semiconductor layer 50 are set to the n-type.

Figure 2:
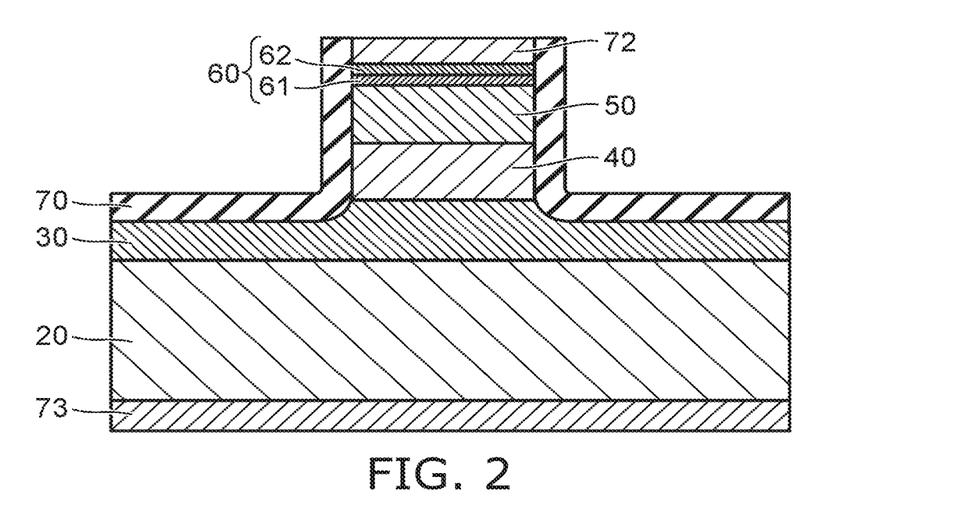
FIG. 2 is a schematic cross-sectional view of the semiconductor laser according to the first embodiment.

FIG. 2 is a schematic cross-sectional view of the semiconductor laser according to the first embodiment.

A stacked body that includes the first semiconductor layer 30, the active layer 40, the second semiconductor layer 50, and the composition evaluation layer 60 and is epitaxially grown on the substrate 20 is patterned into a mesa configuration. The mesa-shaped stacked body is included in a ridge waveguide. In FIG. 2, the dug out depth of the mesa reaches partway through the first light guide layer 33 of the first semiconductor layer 30 provided to be adjacent to the active layer 40. However, the dug out depth of the mesa is not limited to FIG. 2 and may reach partway through the first cladding layer 32 provided below the first light guide layer 33, may reach the lower surface of the active layer 40, or may reach the lower surface of the first semiconductor layer 30.

An insulating film 70 that includes a silicon oxide film and/or a silicon nitride film is provided on the side surface of the ridge waveguide and on the bottom surface exposed at the two sides of the ridge waveguide. An upper electrode 72 is provided on the upper surface of the ridge waveguide (the front surface of the second film 62); and a lower electrode 73 is provided on the back surface of the substrate 20. The ridge waveguide extends in a direction orthogonal to the page surface and is an optical resonator between the two end surfaces. A surface-emitting structure may be used in which a two-dimensional photonic crystal is provided inside the first semiconductor layer or the second semiconductor layer without providing a ridge waveguide.

Figure 3:
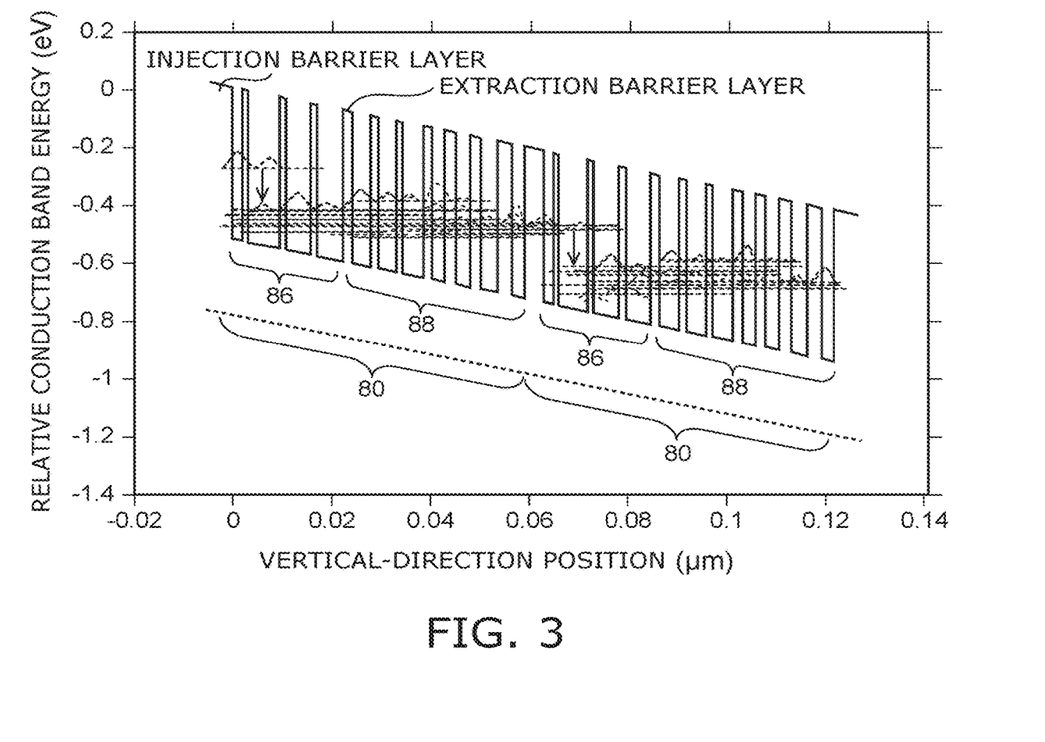
FIG. 3 is a conduction band energy level diagram in the vertical direction of the active layer.

FIG. 3 is a conduction band energy level diagram in the vertical direction of the active layer.

The vertical axis is the relative conduction band energy (eV); and the horizontal axis is the vertical-direction position (μm). One period of a multi-quantum well structure 80 included in the active layer 40 is made of a pair of a light-emitting multi-quantum well region 86 and an injection multi-quantum well region 88. The light-emitting multi-quantum well region 86 includes multiple well layers and multiple barrier layers. The well layer includes the second compound semiconductor. The barrier layer includes the first compound semiconductor.

When a potential difference is applied to the active layer 40 from above and below, an electron undergoes an intersubband transition in the light-emitting multi-quantum well region 86; and a laser oscillation of a wavelength corresponding to the transition level occurs. On the other hand, the energy of the electron after the intersubband transition relaxes as the electron is transported through the injection multi-quantum well region 88; and the electron is injected into the light-emitting multi-quantum well region 86 downstream and again contributes to the intersubband transition.

In the first embodiment, the composition evaluation layer 60 is provided on the front surface of the semiconductor laser wafer. For example, the first film 61 is made of the first compound semiconductor included in the barrier layer. The second film 62 is made of the second compound semiconductor included in the well layer.

For example, the first compound semiconductor may be $In_xAl_{1-x}As$ (0<x<1); and the second compound semiconductor may be $In_yGa_{1-y}As$ (0<y<0). The first film 61 may be the material included in the well layer; and the second film 62 may be the material included in the barrier layer.

Table 1 illustrates a configuration example of one period of the set active layer structure included in the active layer 40.

TABLE 1

| LAYER | MATERIAL | COMPOSITION RATIO | FILM THICKNESS (nm) |
| --- | --- | --- | --- |
| INJECTION BARRIER LAYER | $In_xAl_{1-x}As$ | x = 0.362 | 3.8 |
| WELL LATER | $In_yGa_{1-y}As$ | y = 0.669 | 1.2 |
| BARRIER LAYER | $In_xAl_{1-x}As$ | x = 0.362 | 1.3 |
| WELL LAYER | $In_yGa_{1-y}As$ | y = 0.669 | 4.3 |
| BARRIER LAYER | $In_xAl_{1-x}As$ | x = 0.362 | 1.3 |
| WELL LAYER | $In_yGa_{1-y}As$ | y = 0.669 | 3.8 |
| BARRIER LAYER | $In_xAl_{1-x}As$ | x = 0.362 | 1.4 |
| WELL LAYER | $In_yGa_{1-y}As$ | y = 0.669 | 3.6 |
| EXTRACTION BARRIER LAYER | $In_xAl_{1-x}As$ | x = 0.362 | 2.2 |
| WELL LAYER | $In_yGa_{1-y}As$ | y = 0.669 | 2.8 |
| BARRIER LAYER | $In_xAl_{1-x}As$ | x = 0.362 | 1.7 |
| WELL LAYER | $In_yGa_{1-y}As$ | y = 0.669 | 2.5 |
| BARRIER LAYER | $In_xAl_{1-x}As$ | x = 0.362 | 1.8 |
| WELL LAYER | $In_yGa_{1-y}As$ | y = 0.669 | 2.2 |
| BARRIER LAYER | $In_xAl_{1-x}As$ | x = 0.362 | 1.9 |
| WELL LAYER | $In_yGa_{1-y}As$ | y = 0.669 | 2.1 |
| BARRIER LAYER | $In_xAl_{1-x}As$ | x = 0.362 | 2.1 |
| WELL LAYER | $In_yGa_{1-y}As$ | y = 0.669 | 2 |
| BARRIER LAYER | $In_xAl_{1-x}As$ | x = 0.362 | 2.1 |
| WELL LAYER | $In_yGa_{1-y}As$ | y = 0.669 | 1.8 |
| BARRIER LAYER | $In_xAl_{1-x}As$ | x = 0.362 | 2.7 |
| WELL LAYER | $In_yGa_{1-y}As$ | y = 0.669 | 1.8 |

One period includes the pair of the light-emitting multi-quantum well region 86 and the injection multi-quantum well region 88. For example, the well layers include $In_{0.669}Ga_{0.331}As$ which is the second compound semiconductor; and the barrier layers include $In_{0.362}Al_{0.638}As$ which is the first compound semiconductor. The light-emitting multi-quantum well region 86 includes four well layers; and the injection multi-quantum well region 88 includes seven well layers. In the active layer 40, for example, 30 to 300 periods or the like of the quantum well structure are stacked.

In the actual crystal growth process, the composition ratio and/or the film thickness (the growth rate) fluctuates easily due to external disturbances (the source material flux, the degree of vacuum, the growth temperature, etc.). Therefore, characteristic-defect wafers increase if the ridge waveguide formation, the electrode formation, the formation processes of the end surface reflective films, etc., are performed without performing an evaluation sort of the wafer after the crystal growth. Therefore, the overall yield of the semiconductor laser chips decreases. In other words, the chip yield decreases due to the fluctuation of the epitaxial crystal growth process.

Figure 4:
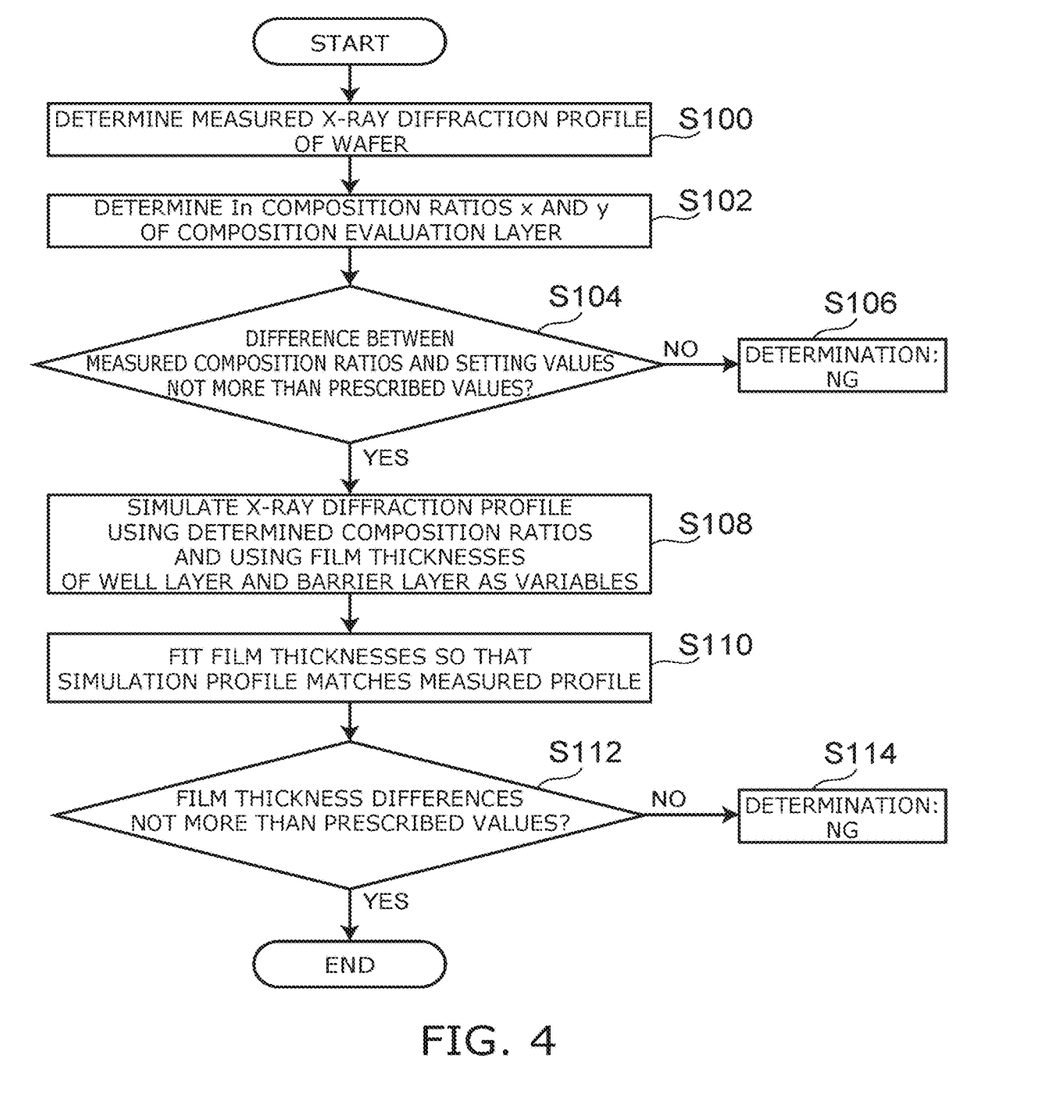
FIG. 4 is a flowchart of an evaluation process of the semiconductor laser wafer according to the first embodiment.

FIG. 4 is a flowchart of an evaluation process of the semiconductor laser wafer according to the first embodiment.

First, X-rays (having a known wavelength λ) are irradiated on the front surface of the composition evaluation layer 60 provided on the semiconductor laser wafer 10; and the X-ray diffraction profile is determined by measuring the diffracted light intensity for the diffraction angles (S100).

The diffracted light intensity is the peak at the position where the diffraction angle is 2θ (θ: Bragg angle). Therefore, a lattice constant of the mixed crystal is determined by Formula (1):

$$d = n\lambda/2 \sin \theta \qquad (1)$$

where n is a natural number. As a result, the composition ratios x and y are determined by utilizing the correlation between the lattice constant of the ternary compound mixed crystal and the composition ratio x (or y).

Figure 5A:
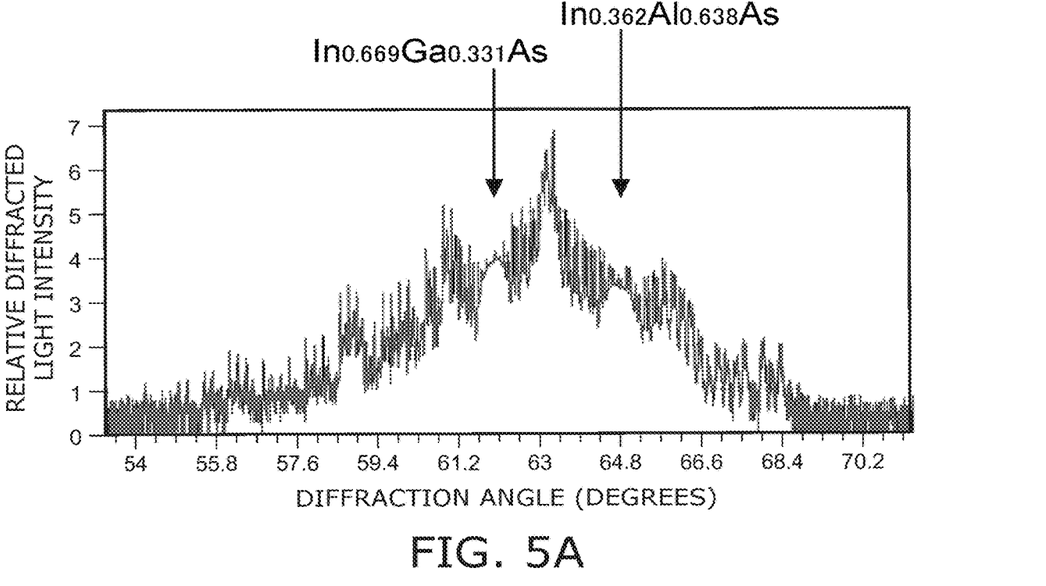
FIG. 5A is a graph of the measured X-ray diffraction profile of the first embodiment.
Figure 5B:
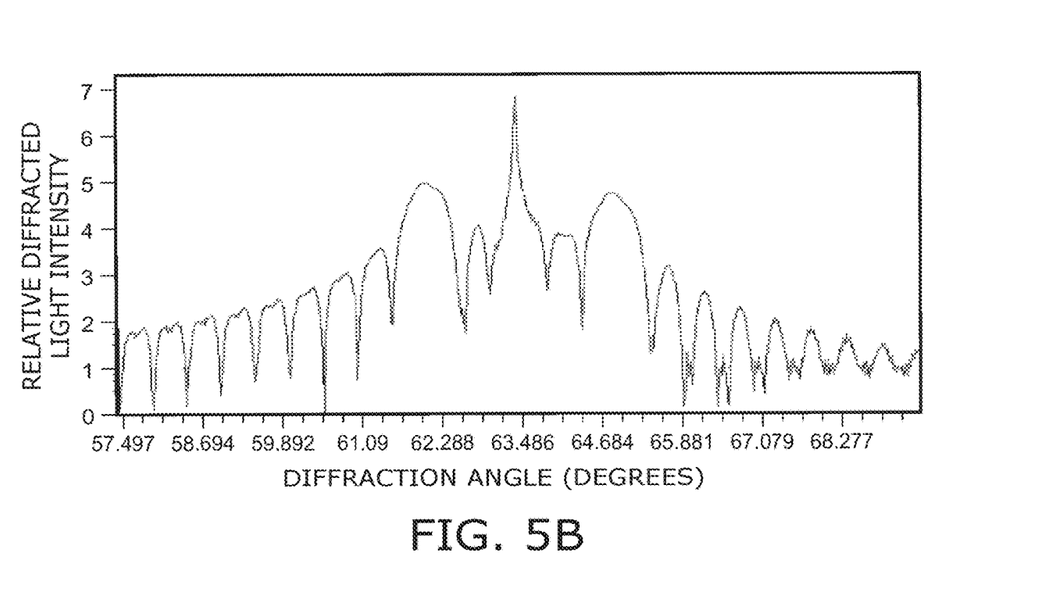
FIG. 5B is a graph determined by simulating the X-ray diffraction profile of a sample structure in which a composition evaluation layer is formed on an InP substrate.

FIG. 5A is a graph of the measured X-ray diffraction profile of the first embodiment; and FIG. 5B is a graph determined by simulating the X-ray diffraction profile of a sample structure in which a composition evaluation layer is formed on an InP substrate.

The vertical axis is the relative diffracted light intensity; and the horizontal axis is the diffraction angle 2θ (θ: Bragg angle). In FIG. 5A, the peak at the diffraction angle of about 63.3 degrees is InP which is the substrate 20. A subpeak of $In_yGa_{1-y}As$ (0<y<1) occurs at the vicinity of 61.8 degrees at the left side of the peak of the substrate 20. Also, a subpeak of $In_xGa_{1-x}As$ (0<x<1) occurs at the vicinity of 64.8 degrees at the right side of the peak of the substrate.

The sample structure of FIG. 5B is a structure in which an $In_{0.362}A_{0.638}As$ film (set thickness: 20 nm) and an $In_{0.669}Ga_{0.331}As$ film (set thickness: 20 nm) are provided in this order on an InP substrate. In the X-ray diffraction profile according to the simulation, a subpeak of $In_{0.669}Ga_{0.331}As$ occurs at a diffraction angle of about 61.8 degrees; and a subpeak of $In_{0.362}A_{0.638}As$ occurs at a diffraction angle of about 64.8 degrees.

A simulation of the sample structure having the composition ratios x and y as variables also is performed. Thus, the composition ratios x and y can be determined so that the X-ray diffraction profile that is obtained according to the simulation matches the measured X-ray diffraction profile of FIG. 5A (S102).

Figure 6:
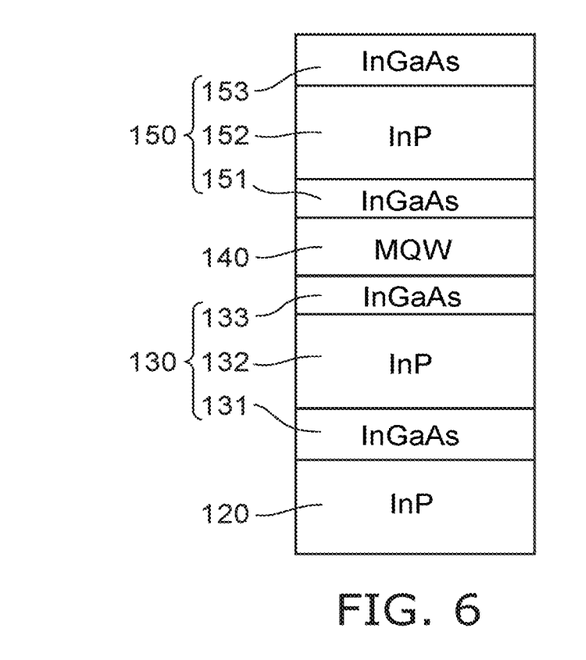
FIG. 6 is a schematic cross-sectional view of a semiconductor laser wafer according to a comparative example.

FIG. 6 is a schematic cross-sectional view of a semiconductor laser wafer according to a comparative example.

An active layer 140 has the same structure as that of Table 1; but a composition evaluation layer is not provided. In the X-ray diffraction profile of the comparative example, the peak of the diffracted light intensity of $In_xAl_{1-x}As$ and the peak of the diffracted light intensity of $In_yGa_{1-y}As$ of the composition evaluation layer are weak. Therefore, the accuracy of the composition ratios is insufficient when determining the composition ratios x and y from the measurement of the measured X-ray diffraction profile.

Also, if the film thicknesses of the first film 61 and the second film 62 are less than 5 nm, the diffracted light intensity decreases; and the detection sensitivity decreases. On the other hand, if the film thicknesses are greater than 30 nm, the crystallinity of the entire wafer decreases because the critical film thickness is approached. Therefore, it is favorable for the film thicknesses of the first film 61 and the second film 62 to be not less than 5 nm and not more than 30 nm. By providing the composition evaluation layer 60 further toward the wafer front surface side than the active layer 40, the attenuation of the X-rays in the wafer interior can be reduced.

Then, when the differences between the determined composition ratios x and y and the setting values of the composition ratios illustrated in Table 1 each are not more than the prescribed values, the composition ratios x and y are taken to be in the tolerance ranges (S104); and the flow proceeds to the next evaluation process. On the other hand, when the differences between the measured composition ratios x and y and the setting values of the composition ratios illustrated in Table 1 are greater than the prescribed values, the wafer is determined to be a defective wafer because the composition ratios x and y do not satisfy the tolerance ranges (S106). For example, the reference prescribed value can be set so that the absolute value of the difference between the determined composition ratio and the setting value (Table 1) is 10% of the setting value, etc. The chip yield can be increased by performing the evaluation process of the composition ratios x and y described above after the crystal growth process. To further increase the chip yield, it is favorable to add an evaluation process of the film thickness.

Figure 7A:
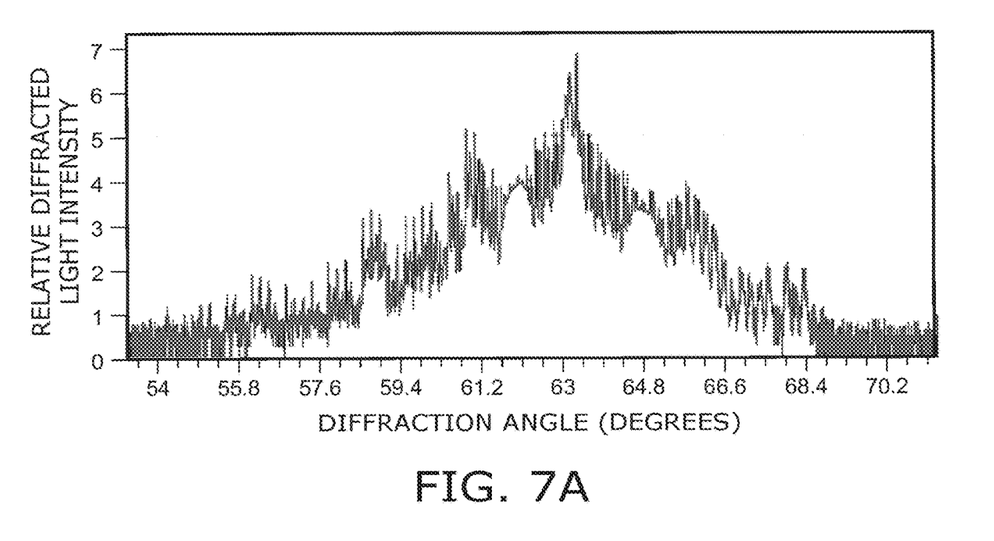
FIG. 7A is a graph of the measured X-ray diffraction profile of the first embodiment.
Figure 7B:
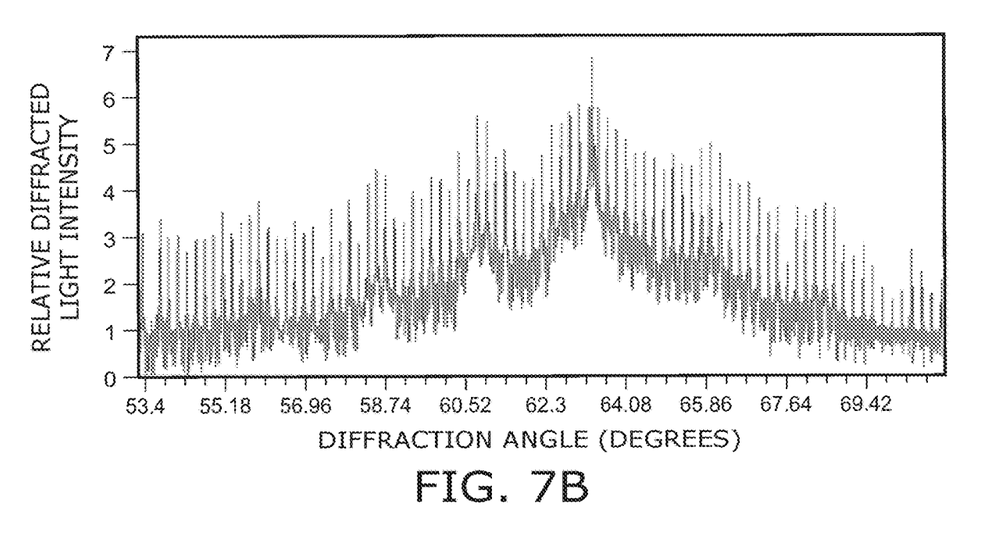
FIG. 7B is a graph of an X-ray diffraction profile of the structure of the first embodiment determined by a simulation.

FIG. 7A is a graph of the measured X-ray diffraction profile of the first embodiment; and FIG. 7B is a graph of an X-ray diffraction profile of the structure of the first embodiment determined by a simulation.

FIG. 7A is the measured X-ray diffraction profile of the first embodiment and is the profile obtained in step S100 (the same as FIG. 5A).

On the other hand, the X-ray diffraction profile is simulated by setting the composition ratios of In to the composition ratios x and y determined in step S102 and by using the film thickness of the well layer and the film thickness of the barrier layer as variables (S108). In such a case, for example, film thicknesses corresponding to the last two layers (the InAlAs layer having a thickness of 2.7 nm and the InGaAs layer having a film thickness of 1.8 nm) of the MQW setting values of Table 1 can be used as the two variables. The assumptions of the simulation are that the growth rates of InGaAs and InAlAs are constant over the entire active layer 40, and the composition ratios x and y are the values determined in step S102.

The two film thicknesses are fit so that the profile obtained by the simulation matches the measured X-ray profile (FIG. 7A) (S110). In such a case, for example, the correlation between the satellite peak and subpeak intensities, the diffraction angles, the film thicknesses, etc., can be utilized. The positions of the two film thicknesses used as variables can be selected from the configuration of Table 1.

The film thicknesses (two) of the X-ray diffraction profile obtained by the fitting are determined to be in tolerance ranges when the differences between the film thicknesses (two) and the film thicknesses of the setting values of Table 1 are not more than the prescribed values (S112); and the wafer is determined to be a non-defective wafer. On the other hand, the wafer is determined to be a defective wafer when the film thickness differences are greater than the prescribed values (S114). The prescribed value can be set so that, for example, the absolute value of the film thickness difference is 10% of the setting value, etc.

In the semiconductor laser wafer 10 of the embodiment, the composition evaluation layer 60 is provided between the active layer 40 and the wafer front surface or between the active layer 40 and the wafer front surface. The In composition ratio y of the well layer and the In composition ratio x of the barrier layer included in the active layer 40 are determined by the X-ray diffraction measurement in the wafer state. Also, the X-ray diffraction profile is simulated by using the composition ratios x and y determined by the measurements and by using the film thickness of the well layer and the film thickness of the barrier layer as variables. The external disturbances that occur in the crystal growth process include not only the fluctuation of the source material flux but also the fluctuation of the degree of vacuum, the fluctuation of the growth temperature, etc. Therefore, the simulation accuracy of the film thickness fluctuation can be increased by performing the X-ray diffraction profile simulation of the wafer by using the four variables. As a result, the semiconductor laser chip yield can be increased.

In the simulation of the X-ray diffraction profile, the diffraction angle where the diffracted light intensity is the peak is proximal to the InP diffraction angle for the cladding layers (e.g., InP) 32 and 52, the light guide layers (e.g., InGaAs) 33 and 51, the contact layers (e.g., InGaAs) 31 and 53, etc. Therefore, the effects on the X-ray diffraction profile can be small. Of course, the composition ratios of these layers can be determined individually.

Figure 8:
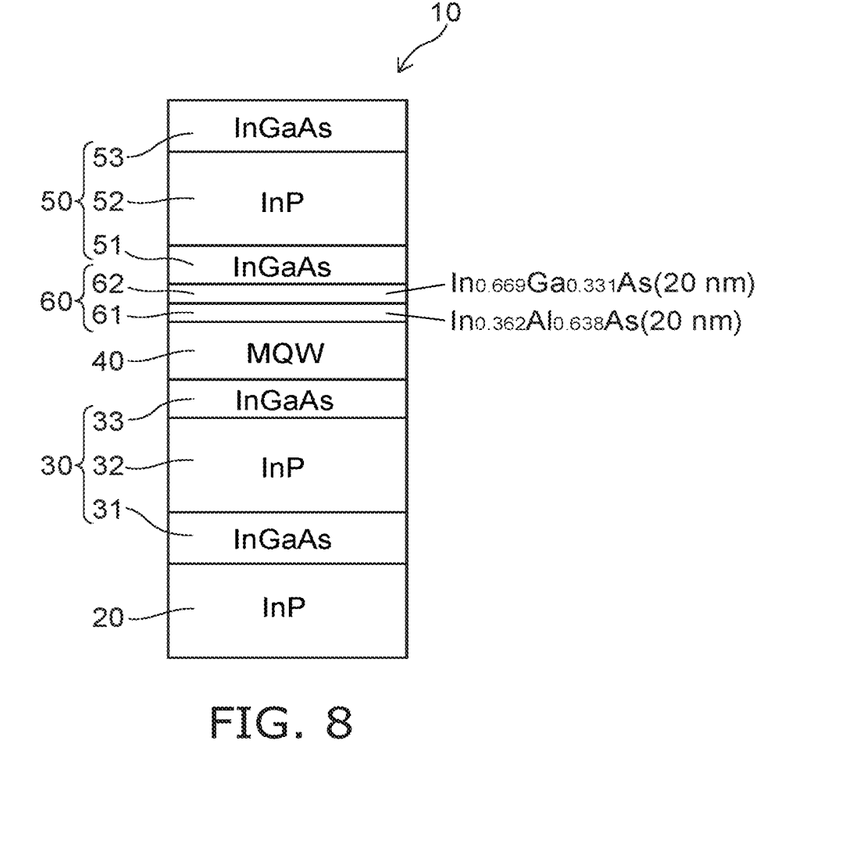
FIG. 8 is a schematic cross-sectional view of a semiconductor laser wafer according to a modification of the first embodiment.

FIG. 8 is a schematic cross-sectional view of a semiconductor laser wafer according to a modification of the first embodiment.

The composition evaluation layer 60 may be provided between the active layer 40 and the front surface of the semiconductor laser wafer 10. If the composition evaluation layer 60 is provided lower than the active layer 40, the optical path of the X-rays lengthens; attenuation and the like occurs; and the detection sensitivity decreases. In the modification of the first embodiment, a guide layer, a cladding layer, a contact layer, etc., are provided between the active layer 40 and the composition evaluation layer 60.

The thickness of the cladding layer is large, i.e., 2 to 10 μm, etc. The impurity concentration of the contact layer is higher than the impurity concentration of the cladding layer. Therefore, there is a possibility that the growth conditions may be changed between the crystal growth process of the active layer 40 and the crystal growth process of the composition evaluation layer 60. Conversely, in the modification, the change of the growth conditions can be small between the crystal growth process of the active layer 40 and the crystal growth process of the composition evaluation layer 60. Therefore, the simulation accuracy can be high.

The semiconductor laser may be an interband cascade laser (ICL). In such a case, the active layer is provided on the first semiconductor layer and includes multiple periods of the pair of the light-emitting multi-quantum well region made of the first compound semiconductor and the second compound semiconductor and the injection multi-quantum well region made of the first compound semiconductor and the second compound semiconductor. Electrons are injected into the light-emitting multi-quantum well region from the electron injection layer of the injection multi-quantum well region on the upstream side; and holes are injected into the light-emitting multi-quantum well region from the injection multi-quantum well region on the downstream side. As a result, the electrons and the holes recombine in the light-emitting multi-quantum well region; and infrared laser light that corresponds to the interband transition level formed in the light-emitting multi-quantum well region is emitted.

According to the embodiment, a semiconductor laser is provided in which the productivity of the semiconductor laser chip is high and infrared can be emitted. The semiconductor laser is utilized in environmental measurements, infrared detection, the detection of designated substances, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor laser wafer, comprising:
   a substrate;
   a first semiconductor layer provided on the substrate;
   an active layer provided on the first semiconductor layer, multiple periods of pairs of a light-emitting multi-quantum well region and an injection multi-quantum well region being stacked in the active layer, the light-emitting multi-quantum well region being made of a first compound semiconductor and a second compound semiconductor, the injection multi-quantum well region being made of the first compound semiconductor and the second compound semiconductor;
   a second semiconductor layer provided on the active layer; and
   a composition evaluation layer including a first film and a second film and being provided above the active layer, the first film being made of the first compound semiconductor and having a first thickness, the second film being made of the second compound semiconductor and having a second thickness.

2. The wafer according to claim 1, wherein the composition evaluation layer is provided at least one of on the second semiconductor layer, between the active layer and the second semiconductor layer, or inside the second semiconductor layer.

3. The wafer according to claim 1, wherein
   the first thickness is not less than 5 nm and not more than 30 nm, and
   the second thickness is not less than 5 nm and not more than 30 nm.

4. The wafer according to claim 2, wherein
   the first thickness is not less than 5 nm and not more than 30 nm, and
   the second thickness is not less than 5 nm and not more than 30 nm.

5. The wafer according to claim 1, wherein the first compound semiconductor and the second compound semiconductor each are ternary crystals.

6. The wafer according to claim 2, wherein the first compound semiconductor and the second compound semiconductor each are ternary crystals.

7. The wafer according to claim 3, wherein the first compound semiconductor and the second compound semiconductor each are ternary crystals.

8. A semiconductor laser, comprising:
   a substrate;
   a first semiconductor layer provided on the substrate;
   an active layer provided on the first semiconductor layer, multiple periods of pairs of a light-emitting multi-quantum well region and an injection multi-quantum well region being stacked in the active layer, the light-emitting multi-quantum well region being made of a first compound semiconductor and a second compound semiconductor, the injection multi-quantum well region being made of the first compound semiconductor and the second compound semiconductor;
   a second semiconductor layer provided on the active layer; and
   a composition evaluation layer including a first film and a second film and being provided above the active layer, the first film being made of the first compound semiconductor and having a first thickness, the second film being made of the second compound semiconductor and having a second thickness.

9. The laser according to claim 8, wherein the first compound semiconductor and the second compound semiconductor each are ternary crystals.

10. The laser according to claim 8, wherein the composition evaluation layer is provided at least one of on the second semiconductor layer, between the active layer and the second semiconductor layer, or inside the second semiconductor layer.

11. The laser according to claim 8, wherein
    the first thickness is not less than 5 nm and not more than 30 nm, and
    the second thickness is not less than 5 nm and not more than 30 nm.

* * * * *